United States Patent [19]

Graupe et al.

[11] 4,185,168
[45] Jan. 22, 1980

[54] METHOD AND MEANS FOR ADAPTIVELY FILTERING NEAR-STATIONARY NOISE FROM AN INFORMATION BEARING SIGNAL

[76] Inventors: Daniel Graupe, 2821 Redwing, Fort Collins, Colo. 80521; G. Donald Causey, 3504 Dunlop, Chevy Chase, Md. 20015

[21] Appl. No.: 866,938

[22] Filed: Jan. 4, 1978

Related U.S. Application Data

[63] Continuation-in-part of Ser. No. 707,569, Jul. 21, 1976, abandoned, which is a continuation-in-part of Ser. No. 683,234, May 4, 1976, Pat. No. 4,025,721.

[51] Int. Cl.$^2$ ............................................. H04R 27/00
[52] U.S. Cl. .................... 179/1 P; 179/1 SC
[58] Field of Search .................. 179/1 P, 1 D

[56] References Cited
U.S. PATENT DOCUMENTS

| 3,803,357 | 4/1974 | Sachs | 179/1 P |
| 4,025,721 | 5/1977 | Graupe et al. | 179/1 P |

*Primary Examiner*—Kathleen H. Claffy
*Assistant Examiner*—E. S. Kemeny
*Attorney, Agent, or Firm*—Sandler & Greenblum

[57] ABSTRACT

An input signal containing information such as speech or music as well as near-stationary noise is applied in parallel to a noise-analysis circuit and a noise-reduction circuit, each of which comprises a plurality of bandpass filters covering the range of frequencies associated with the information. The absolute value, or a function thereof, of the output of each bandpass filter in the noise-analysis circuit is produced and smoothed. The presence of near-stationary noise in the input signal is determined by examining the nature of the smoothed signal in each band assuming noise has a frequency spectrum which does not vary with time or varies only within a narrow range over a predetermined period of time with respect to the spectral parameters of the information signal. If noise is detected, the noise-analysis circuit identifies spectral parameters of the information and/or noise in each band using the smoothed signal therein.

In the preferred embodiment of the invention, the bandpass filters of the noise-reduction circuit have gain elements that are adjusted in accordance with the identified parameters to minimize, under some continuous minimization criterion, the effect of the noise in the input signal thus enhancing intelligibility of the information therein. Minimization can be such that the gain-to-parameter relationships are similar to those in Weiner or Kalman filtering theory with a-priori knowledge of the noise, or of the noise and information, except that in this case, a-priori knowledge of the noise is acquired via identification and is not preassumed.

27 Claims, 8 Drawing Figures

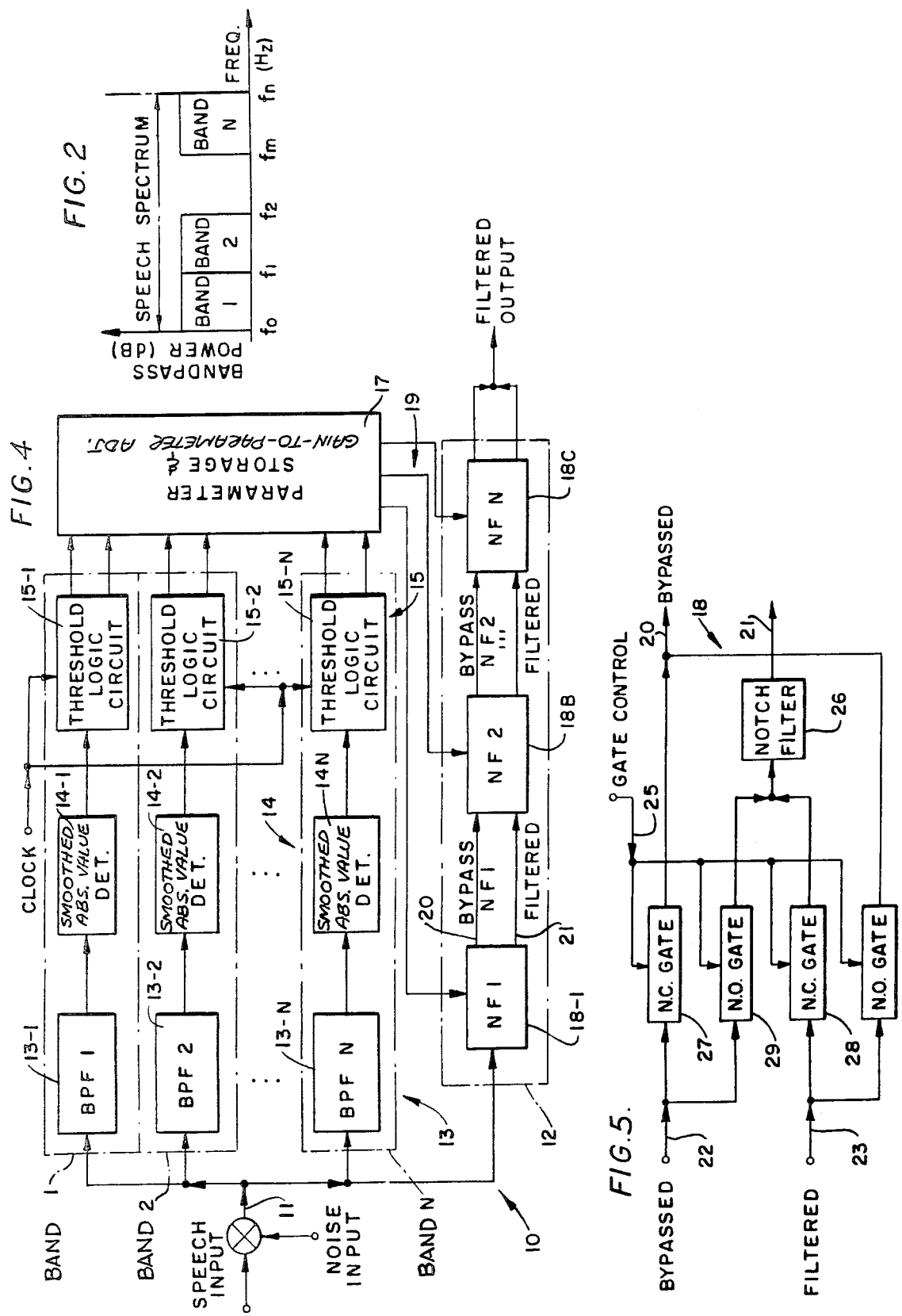

U.S. Patent    Jan. 22, 1980    Sheet 3 of 3    4,185,168
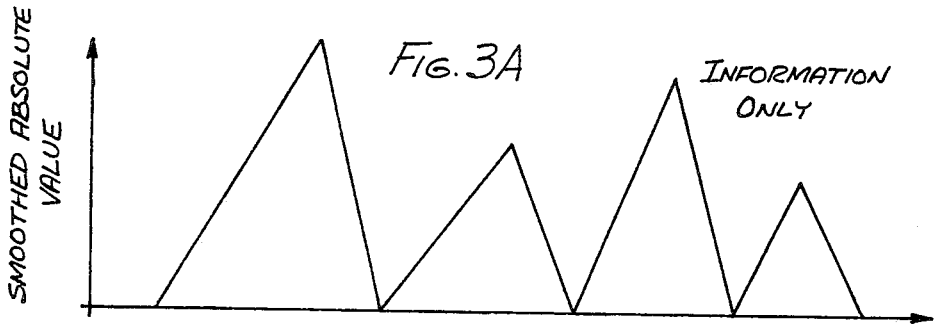
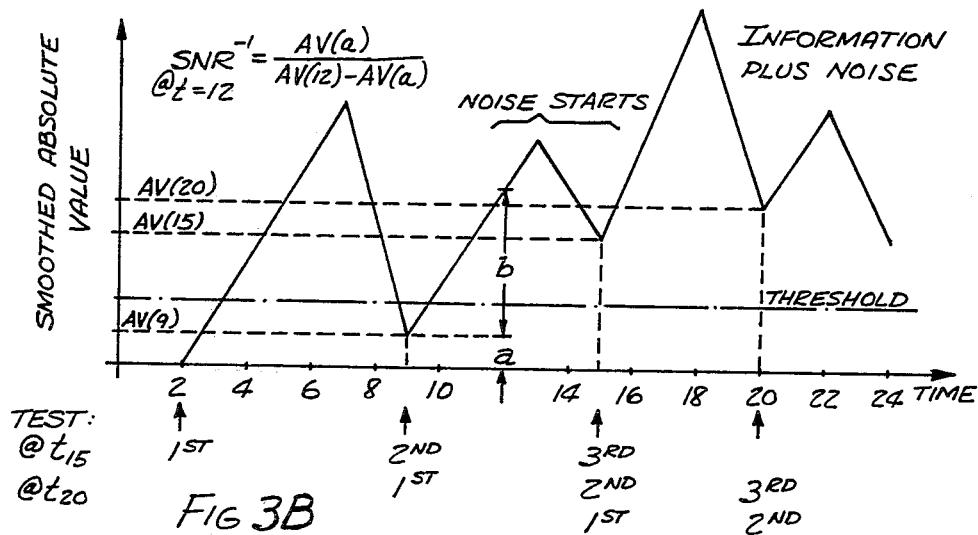
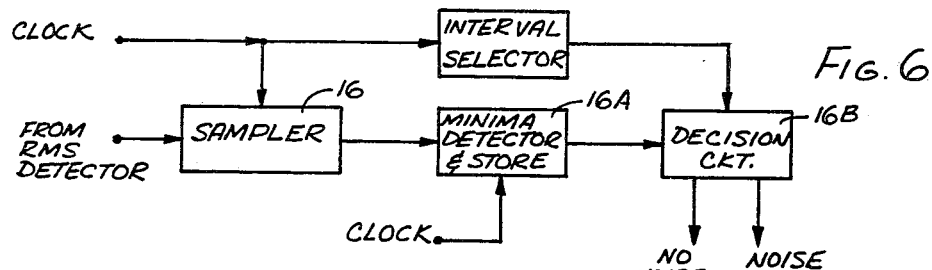
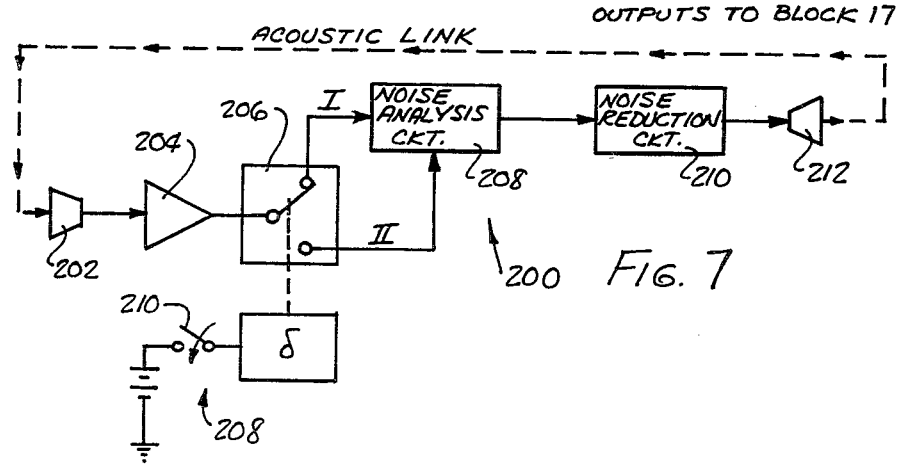

METHOD AND MEANS FOR ADAPTIVELY FILTERING NEAR-STATIONARY NOISE FROM AN INFORMATION BEARING SIGNAL

CROSS-REFERENCE TO RELATED APPLICATION

This application is a continuation-in-part of copending application Ser. No. 707,569, filed July 21, 1976, now abandoned, which application is hereby incorporated by reference. The last mentioned application is, itself, a continuation-in-part of application Ser. No. 683,234, filed May 4, 1976, now U.S. Pat. No. 4,025,721, which patent is hereby incorporated by reference.

BACKGROUND OF THE INVENTION

The invention relates to a method of and means for filtering near-stationary, relatively long duration noise from an input signal containing information such as speech or music.

For the purpose of the present application, the term "near-stationary, relatively long duration noise", is hereinafter referred to as noise of the type described, and refers to noise whose frequency spectrum does not vary with time or varies only within a narrow range over a predetermined period of time particularly with respect to the spectral parameters of the information. Vehicular and machinery noises are examples of noise of the type described. The minimum duration of noise of the type described is thus considerably longer than periods over which the spectrum of normal speech remains nearly fixed, such periods being of the order of a second. In addition, the invention is described below as being applied to filtering noise of the type described from speech, but the invention is also applicable to other information bearing signals.

U.S. Pat. No. 4,025,721 discloses a method of and means for adaptively filtering noise of the type described from speech by recognizing the existence of such noise, identifying its parameters, adjusting the parameters of a filter so as to filter such noise, and applying an input signal containing such noise and speech to the filter. Termination of the noise of the type described is also recognized in order to cause the input signal to then bypass the filter.

Basic to the disclosure of the above identified patent is the necessity for recognition, in an input signal, of pauses between speech intervals. When a pause containing noise of the type described is recognized, the parameters of the noise within the pause are identified and used to adjust the parameters of the filter. Subsequently, the input signal is applied to the filter which is effective to filter the noise from subsequent speech intervals.

SUMMARY OF THE INVENTION

In the present invention, neither recognition of pauses between speech intervals, nor recognition of noise termination, is required; and the hardware for carrying out the present invention is extremely simple and fast. Briefly, identification is performed in the frequency domain alone allowing a spectral filter to be used to achieve the desired filtering of the noise of the type described.

An input signal containing noise of the type described and information, such as speech or music, is applied in parallel to a noise-analysis circuit that includes a plurality of bandpass filters covering the range of frequencies associated with the information. The absolute value, or a function thereof (e.g., the RMS value) of the signal in each band is obtained and smoothed, preferably by computing a running average of the absolute value in the band. In one technique, noise is assumed to be present in the input signal if a threshold is exceeded by all or by a predetermined percentage of successive minima of the smoothed signal in a band. Alternatively, the smoothed signal in each band can be sampled to enable the inverse signal-to-noise ratio ($SNR^{-1}$) to be computed, the presence of noise being assumed if an $SNR^{-1}$ in a band exceeds a threshold. The $SNR^{-1}$ in a sampling interval is computed by taking the ratio of the latest stored lowest minimum of the smoothed signal in a band to the difference between the sampled value of the smoothed signal and such minimum.

If the noise-analysis circuit detects the presence of noise in accordance with the above tests, spectral parameters of the noise, or of the noise and information are then identified by the circuit and used to control the operation of a noise-reduction circuit to which the input signal is also applied. The last mentioned circuit comprises a plurality of bandpass filters having a one-to-one correspondence with the bandpass filters of the noise-analysis circuit. Each of the bandpass filters of the noise-reduction circuit is responsive to a parameter identified from the smoothed signal in the corresponding band of the noise-analysis circuit for minimizing the effect of noise in the input signal on the output of the noise-reduction circuit, minimization occuring under some continuous minimization criterion.

The noise-analysis circuit can identify either noise parameters, or noise and information parameters in a band by utilizing the smoothed signal in the band. A parameter of the noise alone in a band can be in the form of a predetermined function of the lowest one of a predetermined number of successive minima of the smoothed signal in the band. Alternatively, the noise parameter can be in the form of a predetermined function of a more recent minimum of a succession of minima if such recent minimum does not exceed the previous lower minimum by more than a given percentage (e.g., 25%).

On the other hand, a parameter of the noise and information in a band can be in the form of a predetermined function of the signal-to-noise ratio (SNR) in the band. The SNR in a band is the difference between samples of the smoothed signal in the band and the most recently accepted noise-related minimum of a time-sequence of minima of the smoothed signal. The function's referred to above may be continuous functions of the variables to yield either spectral parameters or their time domain equivalents.

In the preferred form of the invention, the bandpass filters of the noise-reduction circuit have gain elements controlled by the parameters identified by the noise-analysis circuit. When noise parameters alone are identified, the gain-to-parameter relationship necessary to minimize noise may be similar to or approximate a Wiener filter with a-priori knowledge of noise as described in Chapter 8.6 of "Foundations of the Theory of Learning Systems" by Y. Tsypkin, Academic Press, New York (1973). In such case, a-priori knowledge of the noise is obtained via the identification process referred above and is not preassumed.

When both noise and information parameters are identified, the gain adjustment of a bandpass filter will be according to the signal-to-noise ratio in the bandpass to approximate a Kalman filter as described in page 35, Transactions ASME, *Journal of Basic Engineering* (1960). In such a case, filtering will be facilitated even if the noise is white over the whole range of frequencies of interest.

The bandpass filters used in the present invention may be digital filters, or discrete analog filters employing microelectronic tapped analog delays, or conventional analog filters. The combination of analog and logic hardware can also be utilized.

BRIEF DESCRIPTION OF THE DRAWINGS

Embodiments of the present invention are illustrated by way of example in the accompanying drawings wherein:

FIG. 2 is a frequency diagram showing the different bands into which an input signal containing information and noise is divided;

FIG. 3A is a plot showing the time-variation of a running average of the absolute value of a signal in a band in the absence of noise;

FIG. 3B is a plot like FIG. 3A showing the vertical shifting of the running average of the absolute value of a signal when near-stationary noise is present;

FIG. 4 is a block diagram of a second form of an adaptive filter according to the present invention;

FIG. 5 is a detail of one of a typical notch-filter of the noise-elimination circuit shown in FIG. 4;

FIG. 6 is a block diagram of a threshold logic circuit shown in FIG. 4; and

FIG. 7 is a block diagram of a hearing aid incorporating the first embodiment of the adaptive filter but providing for suppression of acoustic feedback.

DETAILED DESCRIPTION

Figure 1:
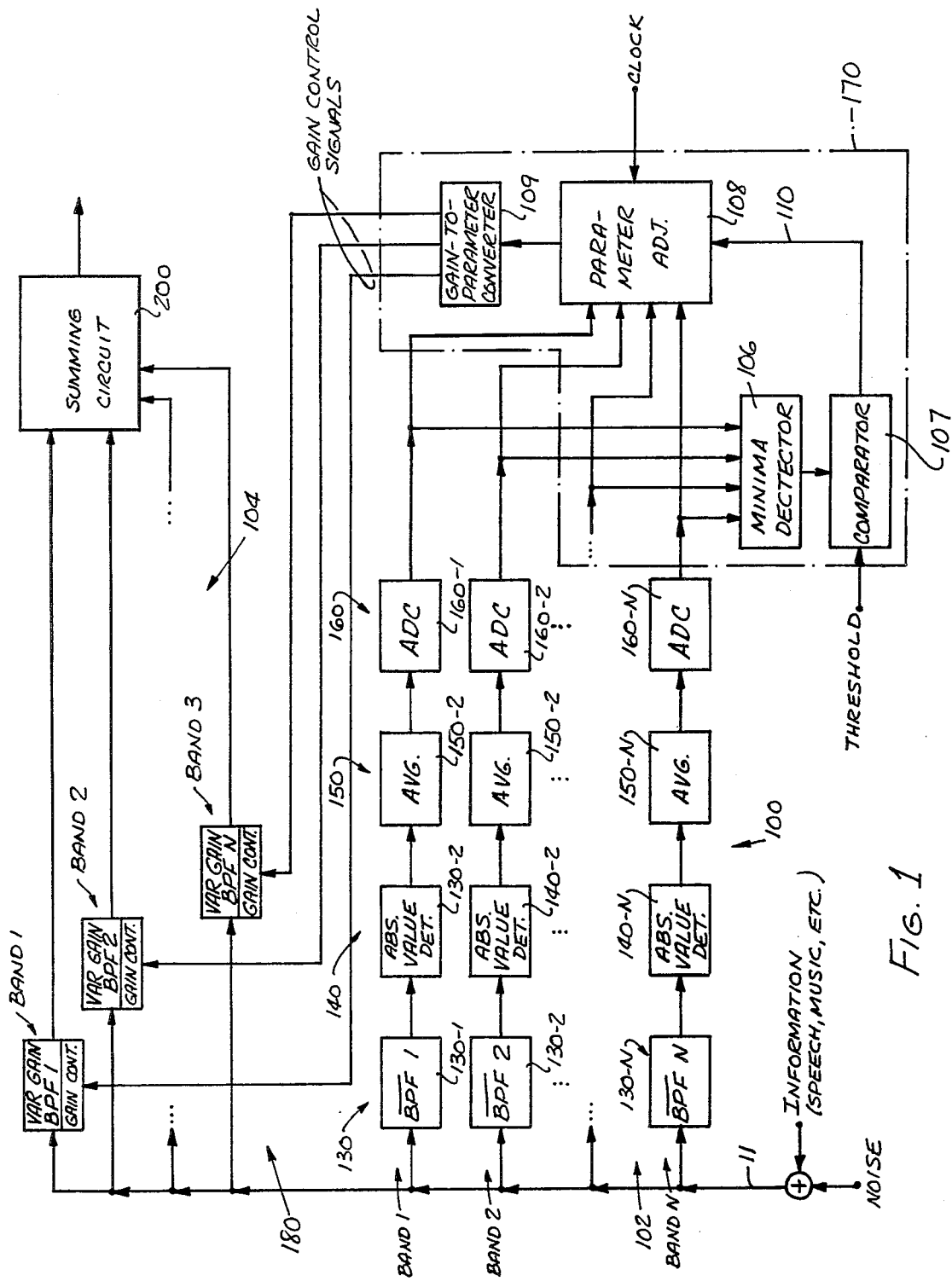
FIG. 1 is a block diagram of the preferred form of an adaptive filter according to the present invention.

Referring now to the drawing, reference numeral 100 designates the preferred embodiment of an adaptive filter according to the present invention. Filter 100 comprises a noise-analysis circuit 102 and noise-reduction circuit 104. Each of circuits 102 and 104 comprises a plurality of bandpass filters that divide the input signal into a plurality of frequency sensitive bands 1, 2, . . . N, the bands in each of the circuits having a one-to-one correspondence. An input signal comprising both information and noise of the type described, is applied via line 11 in parallel to each bandpass filter. Each of the bands in circuit 102 contains a bandpass filter 130, a detector 140, and a smoothing circuit 150 serially connected together. Each component in a band is designated by a reference numeral associated with the component followed by a hypen and a number designating the band. For example, bandpass filter BPF 1 of band 1 of circuit 102 is designated 130-1.

Each of the bands 1, 2, . . . N, covers a unique band within the range of frequencies associated with the information. This is illustrated in FIG. 2 which shows an information spectrum as extending from frequency $f_o$ to $f_n$ and being divided into N bands that correspond to the N bands of the filters of circuit 102. If the information is speech, the spectrum could extend from 50 Hz to 6500 Hz in N steps, the upper limit having been chosen to correspond to the upper cut-off of hearing aids in current use. If the information is music, the spectrum would be substantially larger. Ideally, each bandpass should have sharply defined cut-offs of infinite slope, but it is sufficient for the bandpass of the filters to approximate the ideal situation illustrated in FIG. 2.

A detector 140 in a band downstream of a bandpass filter 130 converts the signal passed thereby into the absolute value of such signal, or a function thereof, as for example, the RMS value of the signal. The absolute value signal is passed through an averaging circuit 150 that smooths the signal, preferably by producing a running average of the absolute value. The resultant smoothed signal is in analog form, and is converted to digital form by analog-to-analog convertor 160.

The output of each band is then applied to microprocessor 170 of circuit 102. The microprocessor can be programmed to process the applied data for the purpose of detecting the presence of noise in the input signal, identifying the noise or noise and information parameters if noise is detected, and adjusting the gain of each of the bandpass filters 180 of circuit 104 in a way that reduces the noise in the output of this circuit. Alternatively, the outputs of bandpass filters 130 could be applied directly to the microprocessors 170 through an ADC unit. In such case, the microprocessor would be programmed to compute the absolute value, smooth the same, and then examine the data to determine whether noise is present in the input signal before identifying the parameters, etc.

The presence of noise in the input signal is assumed when the smoothed signal in any band is such that a threshold is exceeded by all or by a predetermined percentage of successive minima of the smoothed signal. For example, the criterion for deciding if noise is present may be whether two out of three successive minima exceed a threshold in a given band. This test for noise is easily carried out by detecting minima in the smoothed signal in a band, storing three successive minima and comparing the value of each with a threshold. If less than two exceed the threshold, the next minimum produced replaces the first minimum stored in this group, and a new threshold test is made. Reference can be made to FIG. 3A which represents, in idealized form, the output in one band of averaging circuit 150, i.e., a smoothed signal whose variation with time is due solely to information in the input signal. As indicated in FIG. 3B, noise begins between intervals 10 and 12 on the time scale. Microprocessor 170 might sample the smoothed signal at the times indicated in the time scale in FIG. 3B with the result that by interval 15, three minima would have occurred, namely the minima at the second, ninth, and fifteenth time interval. At that instant, three registers (not shown) would contain the values AV(2), AV(9) and AV(15) as indicated. A comparison of these values with the threshold would show that only one out of the three minima exceeds the threshold. Under the criterion established above, a decision would be reached at the 15th interval that no noise is present in the input. When the next minima occurs at interval 20, the three registers in the microprocessor would contain the minima AV(9), AV(15) and AV(20) associated with the ninth, fifteenth, and twentieth intervals. When the test is made at the twentieth interval, two out of the three amplitudes would exceed the threshold with the result that the microprocessor would conclude that noise was present in the input signal.

Alternative to the above criterion, a value of the inverse signal-to-noise ratio ($SNR^{-1}$) in a band in excess of a threshold can be used as a test for the presence of noise in the input signal. In order to compute $SNR^{-1}$, the smoothed signal in a band is sampled at intervals over which the information parameters in the input signals are substantially constant (e.g., at intervals of 10–30 milliseconds for speech). The $SNR^{-1}$ in a sampling interval is computed by taking the ratio of the latest stored lowest minimum of the smoothed signal to the difference between the sampled value of the smoothed signal and such minimum. FIG. 3 illustrates computation of $(SNR^{-1})_{12}$ which is given by $AV(9)/AV(12)-AV(9)=a/b$.

Once a decision is made that noise is present in the input signal, either noise parameters alone or noise and information parameters in each band are identified in accordance with the minimization process to be followed in controlling the filters of circuit 102. If noise parameters are to be identified, they may be in the form of predetermined functions of the lowest one of a predetermined number of successive minima of a smoothed signal in a band. Updating occurs in accordance with changes in the minima. Alternatively, such parameters may be in the form of predetermined functions of a more recent minimum of a succession of minima if such recent minimum does not exceed the previous lowest minimum by more than a given percentage (e.g., 25%). In either event, the identified parameters are used to adjust the gain elements of the bandpass filters 180 of circuit 102 so that the summed outputs of filters 180, carried out in summing circuit 200, produces an output signal in which the noise is minimized under a continuous minimization criterion thereby enhancing intelligibility of the information in the input signal. A suitable gain-to-parameter relationship that will minimize noise is that which approximates a Wiener filter with a-priori knowledge of the noise. In this case, however, a-prior knowledge of the noise is obtained via the identification process described above and is not preassumed.

If the noise is expected to be white and to exist over the whole range of frequencies of interest, it is advantageous to identify the noise and information parameters in each band. In such case, microprocessor 170 would periodically compute the SNR in each band by computing the difference between the sampled smoothed signal in a band and the latest stored lowest minimum. At the twelfth interval in FIG. 3, such difference is $AV(12)-AV(9)$. The noise and speech parameters are then identified as continuous predetermined functions of such difference. The identified parameters are used to adjust the gain of the bandpass filters 180 of circuit 102 so that the summation of the outputs of filters 180 carried out in summing circuit 200 produces an output signal in which the noise minimized under a continuous minimization criterion thereby enhancing intelligibility of the information in the output signal. A suitable gain-to-parameter relationship that will minimize noise is that which approximates a Kalman filter as described above.

In order to avoid long delays before a decision on the existence of noise is made, the initial non-zero minimum of the smoothed signal in a band will be decided upon as being noise-related and acted upon accordingly, and possibly wrongly, until the next successive minimum occurs. The original decision will be confirmed by the occurrence of other minimum of value close to the original minimum within a relatively small predetermined number of minima. This will possibly result in a short period of improper filtering but it is a small price to pay for fast tracking and filtering of noise.

Microprocessor 170 shown in FIG. 1 has three functions, namely the detection of noise, the identification of the parameters of the noise, and providing gain adjustment information for the filters of circuit 102. These functions can be carried out as indicated above, by suitably programming a general purpose microprocessor of by hard wiring a system. The latter is illustrated in FIG. 1 wherein circuit 170 includes minima detector and storage means 106, comparator 107, parameter identifier 108 and parameter-to-gain converter 109. Means 106 comprises logic and control circuitry for sampling the smoothed signals in each band, for determining the existence of minima, and storing the same for comparison purposes. Alternatively, means 106 is capable of computing $SNR^{-1}$. Threshold comparison is carried out by comparator 107 whose output 110, with respect to each band, is indicative of noise in any band. If desired, the system can be organized so that noise is assumed only if the threshold is exceeded in each band. Parameter identifier 108 is schematically shown as a separate block, but it should be understood that if noise-only parameters are of interest, they will be functions of the lowest minima as determined by means 106. If noise and information parameters are of interest, they will be functions of $SNR^{-1}$ (namely SNR) which can be computed by means 106. Finally, converter 109 establishes the values of the gain elements of the noise-reduction circuit 104 in accordance with Weiner or Kalman filter theory depending on the nature of the parameters identified.

In general, the noise is tracked on the basis that noise parameters change at a rate considerably slower than those of speech, the latter changing considerably over intervals of about 15 milliseconds. Hence, the data for computing noise parameters is based on the lowest minimum in a sequence of say two or three successive minima of the absolute values of a smoothed output in a band, where smoothing is sufficient to eliminate variations in frequencies above say 30 Hz. Furthermore, if three successive minima are considered, and one has a value of say twice the previous one, then the next minima is considered to represent a drop in speech. If all three later minima are, however, considerably higher than the initial minima, this serves to indicate that noise parameters have changed, the comparison of the three successive minima serving as a test of the stationary nature of the noise. If only a gradual change of a few percent is observed in the value of successive minima, this serves to indicate a slow drift in noise parameters within the framework of quasi-stationarity, and the noise parameters are then updated accordingly. Speech parameters, however, are updated at every 10–30 milliseconds and no stationarity test is performed on them.

The present invention is particularly well suited for use in hearing aids to facilitate transmission of intelligence in noisy environments. However, the ability of the above described embodiment to selectively filter noise in a given band without affecting transmission in other bands permits acoustic feedback to be compensated for without significantly reducing the performance characteristics of the filter. Because acoustic feedback in a hearing aid occurs in a particular band, identification of the band and the provision of suitable gain reduction in that band will eliminate the ringing problem.

Ringing in a hearing aid is dependent on the hearing aid system itself, and thus cannot be treated as environmental noise. Indeed, with respect to ringing, an adaptive filter of the present invention incorporated into a hearing aid is, itself, a part of the feedback loop that generates the noise. Consequently, elimination of ringing requires the adaptive filter loop to be broken such that the frequency band in which ringing occurs can be identified. During identification, the adaptive nature of the filter is suppressed. Once the frequency band in which ringing takes place is identified, the gain of the filter in the identified band is reduced to eliminate ringing. Thereafter, the adaptive nature of the filter is resumed while maintaining the gain in the band in which ringing was detected at a level below which ringing can occur.

In practice, FIG. 7 shows one approach to solving this problem. Hearing aid 200 comprises a microphone 202 driving a conventional amplifier 204 whose output is applied to electronic switch 206 whose state establishes the mode of noise-analysis circuit 208 that is similar to circuit 102 of the first embodiment. The state of switch 206 is controlled by a delay circuit 208 which is responsive to closure of power switch 210 when the hearing aid is turned on for maintaining switch 206 in an initial state that places circuit 208 in a feedback testing mode. In such mode, which may last about two seconds, circuit 208 is effective to identify any band whose output, during the test interval, is constantly well above the outputs of any of the other bands by more than a predetermined value. When such a band is identified, the gain of the corresponding filter in noise-reduction circuit 210 is reduced to a level that extinguishes the ringing. Such level is remembered by circuit 208 when switch 206 changes state and circuit 208 is placed in its stead-state adaptive filtering mode. In its latter state, circuit 208 adaptively filters noise picked-up by microphone 202 from the output of speaker 212, but the gain in the band in which ringing had been detected is maintained at the remembered level.

A second embodiment of the invention is shown in FIG. 4 wherein reference numeral 10 designates an adaptive filter according to the present invention. Filter 10 comprises noise-analysis circuit 12A and noise-reduction circuit 128. Each of these circuits comprises a plurality of bandpass filters that divide the input signal into a plurality of frequency sensitive bands 1, 2, . . . N, the bands in each of the circuits having a one-to-one correspondence. An input signal, comprising information and noise of the type described is applied via line 11 in parallel to each bandpass filter. Each of the bands in circuit 12A contains a bandpass filter 13, a detector 14 and a threshold logic circuit 15 serially connected together. Each component in a band is designated by a reference numeral associated with the component followed by a hypen and a number designating the band. For example, the bandpass filter of channel 1 is designated 13-1.

A detector 14 in a band downstream of a bandpass filter converts the signal passed thereby into a representation of the absolute value of such signal or a function thereof. The output of each absolute value detector is passed through a threshold logic circuit where it is sampled by a sampling gate under the control of a clock pulse. Preferably, the threshold logic circuit stores representations of the minima of the sampled absolute values over a predetermined time interval, but may also compute the signal-to-noise ratio as described above. A decision on whether the input signal contains noise can be based on either of the two criteria described above, namely whether a predetermined percentage of successive minima of the smoothed absolute value in a band exceeds a threshold, or whether $SNR^{-1}$ exceeds a threshold. As shown in FIG. 6, a threshold logic circuit in a band includes a sampler circuit 16 for sampling the output of the absolute value detector of the band and converting its continuous output into discrete values which may be operated on using digital techniques, and a threshold circuit 16A for detecting minima in the discrete output. Circuit 16A produces a control pulse each time the threshold is exceeded, such pulses being counted by decision circuit 16B.

If the first noise detection criterion is utilized, then a predetermined number of successive minima will exceed the threshold of circuit 16A; and the output of circuit 16B is indicative of the presence of noise of the type described in the input signal. If the converse is true, the output of channel 16B is indicative of the absence of noise in the input signal. In the event $SNR^{-1}$ is computed and used as the criterion for determining whether noise is present, circuit 16B would indicate noise is present in a channel if $SNR^{-1}$, computed in the manner described above, exceeds a threshold. Regardless of the arrangement employed to detect the presence of noise, circuit 16B provides an output to parameter storage means 17 shown in FIG. 4 identifying a band as one containing noise.

Selectively adjustable noise reduction circuit 12 includes a serial array of bandpass filters 18 to which the input signal is applied in parallel with its application to the noise-analysis circuit. The filters 18 can be variable gain bandpass filters as in the case of the first embodiment, or they may be in the form of notch filters centered on the band in which they are located. Filter 18-1 is thus associated with band 1 of the speech spectrum, and with bandpass filter 13-1 of band 1 of the noise-analysis circuit.

Parameter storage means 17 supplies control signals via lines 19 to circuit 12 for the purpose of selectively activating those notch filter means associated with bands containing noise of the type described. The input signal passes serially through those notch filter means associated with bands that have been identified as containing noise, and bypasses the remaining notch filter means. As shown in FIG. 1, an input signal that bypasses a given notch filter means appears in line 20 associated therewith while an input signal that is filtered by the notch filter means appears in line 21. The selection as to whether a given filter means will be bypassed by the input signal, or will filter the same, is determined by the control signal applied to the notch filter means.

FIG. 5 shows a suitable circuit for a typical notch filter means. The input to the notch filter means may appear either in line 22 or in line 23 depending upon whether the upstream notch filter means has been activated by a control signal applied thereto. In the case of notch filter 18-1, one or othe other of lines 22, 23 is not used and the input signal from line 11 is applied to the other. In the absence of an enable signal applied to gate control line 25 of a notch filter means, an input signal in either of lines 22, 23 bypasses notch filter 26 and appears at the bypass line 20. If the upstream notch filter means had not been activated, the signal appearing in line 22 passes through gate 27 by reason of its normally closed state. If the upstream notch filter means had been activated, a signal appearing in line 23 passes through normally closed gate 28 and thus appears in line 20.

A notch filter means is activated when one of the control lines 19 supplies an enabling gate signal to the gate control 25 thereby changing the normal states of gates 27-30. Specifically, gates 27 and 28 are opened by a gate signal and gates 29 and 30 are closed. Thus, a signal in either of lines 22 or 23 will be applied to notch filter 26 so that an output appears on filter line 21. In this manner, the input signal in line 11 is routed through the notch filters of the activated notch filter means and bypassed around the notch filters of those filter means that are not activated.

In operation, the presence of noise of the type described in the input signal in line 11 is detected by one or more of the threshold logic circuits 15 in the N frequency selective channels. The noise or noise and information parameters of such noise can be identified in each band in the manner previously described. Moreover, these parameters are identified at any time, including during a speech interval, without assuming a-priori knowledge of the particulars of the noise or even of its existence. The output signals of the threshold logic circuits specify those notch filters of the notch filter means through which the input signal will be applied for the purpose of adapting the selectively adjustable filter to a condition that filters most of the noise from the input signal. The degree to which the noise is filtered out depends on how close the noise frequencies are to the center-frequencies of the various notch filters and on the SNR levels of the corresponding bandpass filters. However, since many bands are contemplated, it is possible to insure adequate filtering by providing for a sufficient number of bands. Instead of using the control signals in line 19 for completely inserting or removing filters 18, the technique described above in connection with the first embodiment of the present invention can be used, namely, adjusting the gain, and possibly the notch frequency, of the filters.

The bandpass and notch filters shown in the drawings may be digital filters or discrete analog filters employing microelectronic tapped analog delays, or analog filters. The latter two approaches facilitate very fast operation and eliminate the need for analog-to-digital conversion circuitry. Furthermore, while Wiener and Kalman filter theory is described above in connection with the processes for minimizing noise, heuristic minimization criteria could also be used.

It is believed that the advantages and improved results furnished by the method and apparatus of the present invention are apparent from the foregoing description of the preferred embodiment of the invention. Various changes and modifications may be made without departing from the spirit and scope of the invention as described in the claims that follow.

We claim:

1. A method for detecting the presence of noise of the type described, i.e., near stationary, relatively long duration noise, in an input signal containing information such as speech whose parameters change more rapidly than the noise parameters, said method comprising the steps of:
    (a) dividing the input signal into a first set of signals limited to different frequency bands;
    (b) processing the signal in each band to obtain a function of its absolute value; and
    (c) detecting the presence of noise of the type described in the input signal from time-wise variations in the function of the absolute value of the signals in the first set.

2. A method according to claim 1 including the steps of:
    (a) identifying parameters representing the characteristics of at least the noise when its presence in the input signal is detected; and
    (b) passing the input signal through a noise reduction circuit responsive to the identified parameters for minimizing the noise in the output of the circuit under a continuous minimization criterion.

3. A method according to claim 1 including the steps of:
    (a) dividing the input signal into a second set of signals limited to the same bands as the first set whereby the signals in the second set are respectively associated with the signals of the first set; and
    (b) controlling the gain of each signal in the second set in accordance with the time-wise variations in the function in the absolute value of the associated signal in the first set.

4. A method according to claim 2 including:
    (a) smoothing the absolute value of the signal in each band to provide a smoothed signal; and
    (b) comparing the amplitude of successive minima in the smoothed signal in a band with a threshold to detect the presence of noise of the type described in the input signal.

5. A method according to claim 4 wherein the presence of noise is assumed if a predetermined percentage of successive minima exceed a threshold.

6. A method according to claim 5 wherein the percentage is 100%.

7. A method according to claim 4 wherein the smoothing of the absolute value is achieved by computing a running average.

8. A method according to claim 1 including:
    (a) smoothing the absolute value of the signal in each band to provide a smoothed signal;
    (b) sampling and storing the smoothed signal in each band and computing to compute the ratio of the latest stored lowest minimum of the smooth signal in a band to the difference between the sampled value of the smoothed signal and such minima;
    (c) comparing the ratio with a threshold to determine the presence of noise.

9. A method according to claim 4 wherein said parameters are identified in each band using the smoothed signal therein.

10. A method according to claim 9 wherein the parameters are in the form of a predetermined function of the lowest one of a number of successive minima of the smoothed signal in a band.

11. A method according to claim 9 wherein the parameter in a band is in the form of a predetermined function of a later minimum other than the lowest of a succession of minima if such other minimum does not exceed the lowest minimum by more than a given percentage, this later minimum being denoted as the newly accepted lowest minimum.

12. A method according to claim 9 wherein said parameters are frequency domain noise and information parameters.

13. A method according to claim 12 wherein the parameters are in the form of a predetermined function of the difference between samples of the smoothed signal in every band and the most recently accepted noise-related minimum of a time sequence of minima of the smoothed signal.

14. A method according to claim 3 wherein the parameters are in the form of predetermined function of the lowest one of a predetermined number of successive minima of the smoothed signal in a band, and the gain-to-parameter relationship necessary to minimize noise approximates a Wiener filter with a-priori knowledge of noise obtained via the identification process utilized.

15. A method according to claim 12 wherein the parameters are in the form of a predetermined function of the difference between samples of the smoothed signal in every band and the most recently accepted noise-related minimum of a time-sequence of minima of the smoothed signal, and the gain-to parameter relationship necessary to minimize noise approximates a Kalman filter with a-priori knowledge of the noise obtained via the identification process.

16. An adaptive filter for adaptively filtering noise of the type described, i.e., near stationary relatively long duration noise in an input signal containing information such as speech whose parameters change more rapidly than the noise parameters, said filter comprising;
   (a) a noise analysis circuit for detecting the presence of noise of the type described in the input signal and for identifying the parameters representing the characteristics of at least the noise independently of whether information is present in the input signal; and
   (b) a noise reduction circuit having gain elements controlled by the identified parameters for minimizing noise in the output of the circuit.

17. An adaptive filter according to claim 16 wherein the noise analysis circuit includes:
   (a) means for dividing the input signal into a first set of signals limited to different frequency bands;
   (b) means for producing a function of the absolute value of the signal in each band and for smoothing such function to produce a smoothed signal;
   (c) means for storing successive minima of the smoothing signal in a band; and
   (d) means for comparing the amplitude of the stored minima in a band with a threshold for detecting the presence of noise in the input signal.

18. An adaptive filter according to claim 16 wherein the noise analysis circuit includes:
   (a) means for dividing the input signal into a first set of signals limited to different frequency bands;
   (b) means for producing a function of the absolute value of the signal in each band and for smoothing such function to provide a smoothed signal;
   (c) means for sampling the smoothed signal in a band and taking the ratio of the latest stored lowest minimum of the smoothed signal in a band to the difference between the sampled value of the smoothed signal and such minimum; and
   (d) means for comparing the ratio in each band with a threshold for detecting the presence of noise in the input.

19. An adaptive filter according to claim 17 wherein the noise analysis circuit includes means responsive to the lowest one of a number of successive minima of the smoothed signal in a band for forming a function representative of a frequency sensitive noise parameter that identifies the same.

20. An adaptive filter according to claim 17 wherein the noise analysis circuit includes means responsive to a later minimum other than the lowest of a succession of minima in a band if such other minimum does not exceed the lowest minimum by more than a given percentage for forming a function representative of a frequency sensitive noise parameter than identifies the same.

21. An adaptive filter according to claim 17 wherein the noise analysis circuit includes means responsive to the difference between samples of the smoothed signal in a band and and the most recent noise-related minimum of a time sequence of minima of the smoothed signal for forming a function representative of a frequency sensitive noise and information parameter that identifies the same.

22. An adaptive filter according to claim 19 including:
   (a) means for dividing the input signal into a second set of signals limited to the same bands as the first set; and
   (b) means for controlling the gain of each band in accordance with the identified parameters.

23. An adaptive filter according to claim 22 wherein the gain-to-parameter relationship approximates a Weiner filter with a-priori knowledge of noise obtained via the identification process.

24. An adaptive filter according to claim 21 including:
   (a) means for dividing the input signal into a second set of signals limited to the same bands as the first set; and
   (b) means for controlling the gain of each band in accordance with the identified parameters.

25. An adaptive filter according to claim 24 wherein the gain-to-parameter relationship approximates a Kalman filter with a-priori knowledge of the noise and information obtained via the identification process.

26. An adaptive filter according to claim 16 in combination with a hearing aid having a microphone for converting sound into a representation of the input signal and having a speaker for converting the output of the filter into sound, and including means for suppressing acoustic feedback.

27. The combination of claim 26 wherein the noise analysis circuit includes:
   (a) means for dividing the input signal into a first and a second set of signals limited to the same frequency bands;
   (b) means for testing for the presence of ringing in each band of the first set during operation of the hearing aid and identifying the band containing ringing without affecting the second set of signals;
   (c) means for adjusting the gain in each band of the second set; and
   (d) means responsive to identification of a band of containing ringing for reducing the gain in the band of the second set which contains ringing to a level that reduces the ringing.

* * * * *